US011127559B2

(12) United States Patent
Kim et al.

(10) Patent No.: US 11,127,559 B2
(45) Date of Patent: Sep. 21, 2021

(54) PORTABLE VACUUM ANTIOXIDANT BAG

(71) Applicant: KOREA INSTITUTE OF SCIENCE AND TECHNOLOGY, Seoul (KR)

(72) Inventors: So Hee Kim, Seoul (KR); Hee Kyoung Kang, Seoul (KR); Jae Pyoung Ahn, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 17/013,858

(22) Filed: Sep. 8, 2020

(65) Prior Publication Data
US 2021/0090847 A1  Mar. 25, 2021

(30) Foreign Application Priority Data

Sep. 20, 2019 (KR) .................. 10-2019-0116236

(51) Int. Cl.
*H01J 37/20* (2006.01)

(52) U.S. Cl.
CPC ....... *H01J 37/20* (2013.01); *H01J 2237/2002* (2013.01); *H01J 2237/2006* (2013.01)

(58) Field of Classification Search
CPC .. H01J 37/00; H01J 37/02; H01J 37/20; H01J 37/16; H01J 37/18; H01J 37/185; H01J 37/28; H01J 2237/2006; H01J 2237/2002; H01J 2237/28; H01J 2237/204
USPC ............................ 250/306, 307, 311, 442.11
See application file for complete search history.

(56) References Cited

U.S. PATENT DOCUMENTS

| 4,820,000 A * | 4/1989 | Jacobson | B08B 15/026 134/42 |
| 2012/0299452 A1* | 11/2012 | Abreu | B08B 15/026 312/1 |

FOREIGN PATENT DOCUMENTS

| JP | 59-37162 A | 2/1984 | |
| JP | 61002250 A * | 1/1986 | H01J 37/18 |
| JP | 2006-21878 A | 1/2006 | |

OTHER PUBLICATIONS

AtmosBags—Inflatable Polyethylene Isolation Chambers, Product Information, Sigma-Aldrich Co. LLC, 2016 (https://www.sigmaaldrich.com/content/dam/sigma-aldrich/docs/Aldrich/Bulletin/1/AL-211%20AtmosBags.pdf).

* cited by examiner

*Primary Examiner* — Jason L McCormack
(74) *Attorney, Agent, or Firm* — Cantor Colburn LLP

(57) ABSTRACT

A portable vacuum antioxidant bag installed in an electron microscope to prevent oxidation of a sample includes a magnet fixing part formed by attaching a flexible magnet to an opening of the portable vacuum antioxidant bag, a gas inlet and a gas outlet formed on two sides of the portable vacuum antioxidant bag, the gas inlet through which gas is injected into the portable vacuum antioxidant bag, and the gas outlet through which air exits the portable vacuum antioxidant bag by the injected gas, and a pair of gloves formed in a shape of hands toward an inside of the portable vacuum antioxidant bag, wherein the portable vacuum antioxidant bag is tightly contact with the electron microscope due to the magnetic force by the magnet fixing part.

3 Claims, 8 Drawing Sheets

PORTABLE VACUUM ANTIOXIDANT BAG

CROSS-REFERENCE TO RELATED APPLICATION

This application claims priority to Korean Patent Application No. 10-2019-0116236, filed on Sep. 20, 2019 and all the benefits accruing therefrom under 35 U.S.C. § 119, the contents of which in its entirety are herein incorporated by reference.

BACKGROUND

1. Field

The present disclosure relates to a portable vacuum antioxidant bag, and more particularly, to a portable vacuum antioxidant bag using a magnetic element to prevent oxidation of a sample when loading the sample in an electron microscope.

2. Description of the Related Art

Recently, as fire accidents in automobile batteries or development and demand for energy from solar cells sharply increase, the demand for analysis of Li samples susceptible to oxidation dramatically increases. In general, such samples are oxidized upon contact with oxygen when their images are observed in electron microscopes, making it impossible to accurately analyze the samples.

A simplified vacuum barrier system called Atmos bag from Sigma-Aldrich has been almost the only device for blocking oxygen when loading the sample in the electron microscope.

This simplified vacuum barrier system can block oxygen when loading the sample in the electron microscope. But, the Atmos bag is not economical to use, since its price is high (about KRW 130,000 to 180,000) and it is not reusable. A simple way to block oxygen is to attach a tape to the electron microscope, but this way is also not reusable. In addition, according to this method, there is a high likelihood that it fails to fix with the tape and leaks occur, and the sample oxidation problem occurs frequently due to air (oxygen) intrusion. Thus, in this case, it is necessary to analyze the sample again, causing great inconvenience.

In addition, electron microscope manufacturers provide vacuum transfer systems, but the vacuum transfer systems are very expensive and designed to be fixedly attached type, so it is not portable and cannot used alternatively with other electron microscopes.

SUMMARY

The present disclosure is designed to solve the above-described problem, and therefore the present disclosure is directed to providing a portable vacuum antioxidant bag that prevents oxidation of a sample, is low in price and can be reused in various electron microscopes and closely fixed to an electron microscope.

To achieve the above-described object, according to an aspect of the present disclosure, there is provided a portable vacuum antioxidant bag installed in an electron microscope to prevent oxidation of a sample, including a gas inlet and a gas outlet formed on two sides of the portable vacuum antioxidant bag, the gas inlet through which gas is injected into the portable vacuum antioxidant bag, and the gas outlet through which air exits the portable vacuum antioxidant bag by the injected gas, and a pair of gloves formed in a shape of hands inside of the portable vacuum antioxidant bag, wherein the portable vacuum antioxidant bag is tightly contact with the electron microscope by the magnetic force of the magnet fixing part.

According to an embodiment of the present disclosure, the portable vacuum antioxidant bag may further include a vacuum compression part to provide an interface for air removal using a vacuum compressor to remove air from the portable vacuum antioxidant bag.

According to an embodiment of the present disclosure, at least one of the gas inlet or the gas outlet may have an air injection cap that can be opened and closed.

According to various embodiments of the present disclosure, there is provided a portable vacuum antioxidant bag for preventing oxidation of a sample when loading the sample in an electron microscope. Furthermore, the proposed portable vacuum antioxidant bag can be reused and provides the increased economic efficiency. In addition, the portable vacuum antioxidant bag is tightly contact with the electron microscope using a flexible rubber magnet and thus is easy to install, can be installed in various electron microscopes, and effectively prevents air leaks.

The effect that can be obtained from the present disclosure is not limited to the above-mentioned effects, and other effects not mentioned herein will be clearly understood by those having ordinary skill in the art from the following description.

DETAILED DESCRIPTION

Figure 1A:
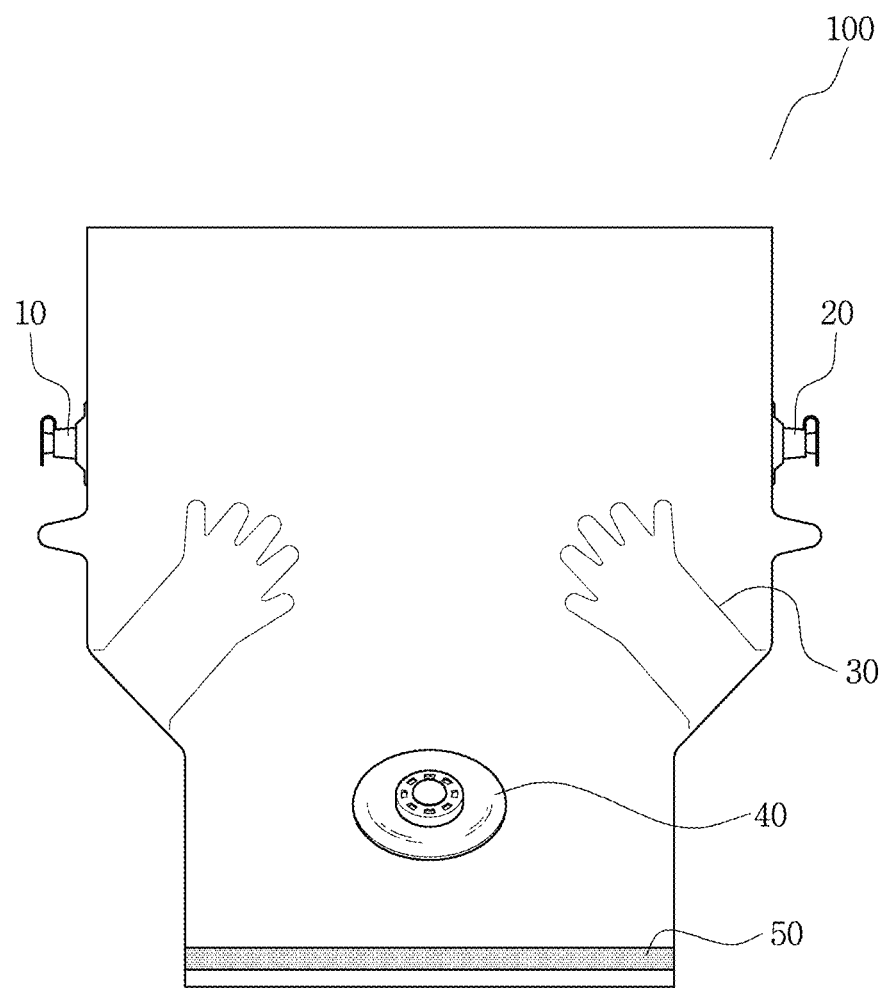
FIGS. 1A and 1B are a plane view and a conceptual view of a portable vacuum antioxidant bag according to an embodiment of the present disclosure, respectively.

The present disclosure may be modified in different forms and may have many embodiments, and thus it is intended to illustrate particular embodiments in the drawings and specify the particular embodiments in the detailed description. This is not intended to limit the present disclosure to the particular embodiments, and it will be understood that the present disclosure includes all modifications, equivalents or substitutes within the spirit and scope of the present disclosure.

In describing the present disclosure, the terms "first", "second", and the like may be used to describe various elements, but the elements should not be limited by the terms. These terms may be used to distinguish one element from another.

For example, a first element may be referred to as a second element without departing from the scope of protection of the present disclosure, and likewise, a second element may be referred to as a first element.

The term "and/or" as used herein may include a combination of relevant items or any of relevant items.

In contrast, it will be understood that when an element is referred to as being "directly connected to" or "directly coupled to" another element, intervening elements are absent.

The terminology used herein is for the purpose of describing particular embodiments only and is not intended to be limiting of the present disclosure. As used herein, the singular forms may include the plural forms as well, unless the context clearly indicates otherwise.

It will be understood that the term "comprises" or "includes" when used in this specification, specifies the presence of stated features, integers, steps, operations, elements, components or groups thereof, but does not preclude the presence or addition of one or more other features, integers, steps, operations, elements, components, or groups thereof.

Unless otherwise defined, all terms including technical and scientific terms as used herein have the same meaning as commonly understood by those having ordinary skill in the technical field pertaining to the present disclosure.

It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

Hereinafter, exemplary embodiments of the present disclosure are described with reference to the accompanying drawings. The present disclosure is described based on a portable vacuum antioxidant vinyl bag type shown in the drawings, but this description is for the purpose of illustration only, and the scope of the present disclosure is not limited thereto.

Figure 1B:
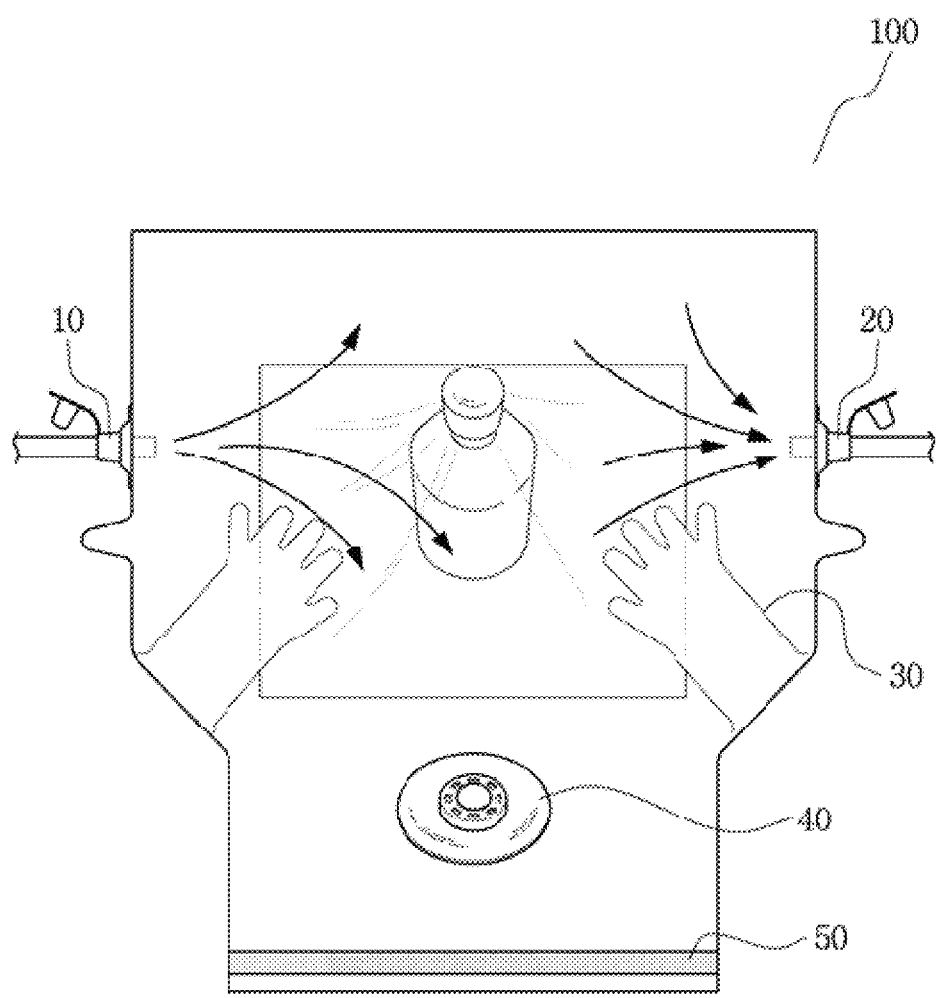

FIGS. 1A and 1B are a plane view and a conceptual view of a portable vacuum antioxidant bag 100 according to an embodiment of the present disclosure respectively.

Referring to FIGS. 1A and 1B, the portable vacuum antioxidant bag 100 according to an embodiment of the present disclosure includes a gas inlet 10, a gas outlet 20, gloves 30, a vacuum compression part 40 and a magnet fixing part 50. The portable vacuum antioxidant bag 100 may be made of transparent vinyl, but is not necessarily limited thereto, and may be made of a variety of transparent materials as long as it can be changed in shape freely and have a proper strength to maintain a vacuum state.

According to an embodiment of the present disclosure, the portable vacuum antioxidant bag 100 has a generally rectangular shape, and is in the shape of a vinyl bag that is closed all over except the gas inlet 10, the gas outlet 20, the vacuum compression part 40 and the magnet fixing part 50. For example, the rectangular body may include the gas inlet 10 and the gas outlet 20 on the opposite surfaces, and an area in which the magnet fixing part 50 is located at the body may have a rectangular shape with a smaller width. The body and the connection area of rectangular shape with a smaller width in which the magnet fixing part 50 is located may be connected in the shape of slopes. In addition, the gloves 30 in the shape of hands inside of the portable vacuum antioxidant bag 100 may be formed on the slopes. The above-described shape facilitates a task of handling a sample in a vacuum state after putting the hands into the gloves 30.

As shown in FIG. 1B, the gas inlet 10 and the gas outlet 20 may be formed on the opposite sides of the portable vacuum antioxidant bag 100. Accordingly, a passage may be provided between the gas inlet 10 and the gas outlet 20 so that gas is injected through the gas inlet 10, and air in the portable vacuum antioxidant bag 100 exits through the gas outlet 20 by the injected gas, to make an oxygen free vacuum.

Figure 2:
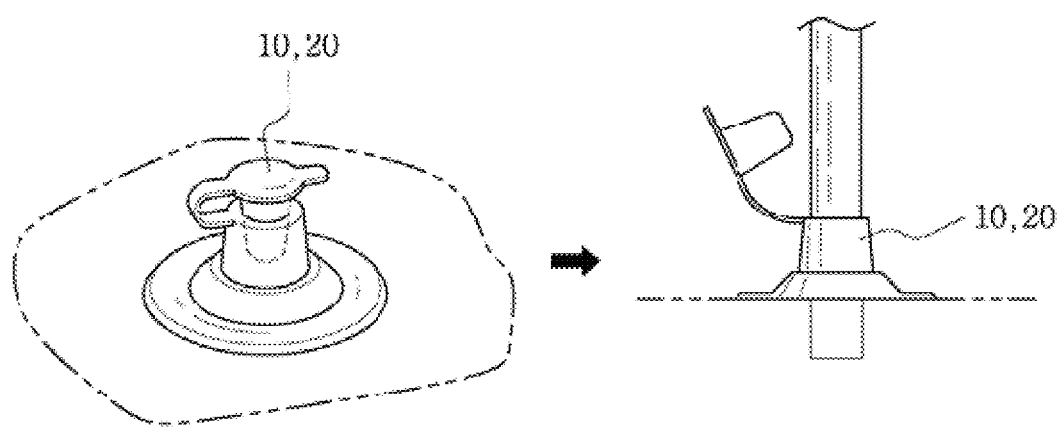
FIG. 2 is a detailed view of an air injection cap of a gas inlet of a portable vacuum antioxidant bag according to an embodiment of the present disclosure.

Since the traditional method includes cutting a part of a gas injection portion of a vinyl bag with scissors, inserting a gas hose and fixing it to the bag with a tape, leaks occur in the cut part, and it is not easy to block air. According to an embodiment of the present disclosure, as shown in FIG. 2, the gas inlet 10 may have an air injection cap which allows inserting a hose that fits the air injection cap, and makes it easy to inject gas and block air. In the same way the gas inlet 10, the gas outlet 20 may have an air injection cap which is easy to open and close.

The gas injected through the gas inlet 10 may primarily include argon (Ar) gas. After the gas is injected and air in the portable vacuum antioxidant bag 100 is replaced with the injected gas, the inside of the bag can be kept in oxygen free state by closing the air injection cap.

As shown in FIG. 1B, the gloves 30 may be formed in the shape of hands the inside of the portable vacuum antioxidant bag on the slopes connecting the two areas having different widths. In addition, the gloves 30 may be provided as a means for contacting with the sample, outside the bag, which allows to handle the sample in a vacuum state.

The vacuum compression part 40 may be used to remove oxygen from the portable vacuum antioxidant bag more easily. If air is not removed from the portable vacuum antioxidant bag and gas, for example, argon is injected to create a vacuum, it is difficult to determine the point in time when air completely exits the portable vacuum antioxidant bag 100. Accordingly, there is a risk that oxygen may remain in the portable vacuum antioxidant bag 100, and to prevent the risk, it is necessary to use a sufficient amount of gas, resulting in low economic efficiency. In addition, according to the traditional method, it is impossible to see if oxygen remains in the bag, and thus the required purging time is 1 hour or longer. To solve this problem, the portable vacuum antioxidant bag may include the vacuum compression part 40 as an interface for air removal using a vacuum compressor. After air is removed from the portable vacuum antioxidant bag using the vacuum compressor of the vacuum compression part 40, when gas, for example, argon is injected through the gas inlet 10, it is possible to reduce the risk of residual oxygen, and see the air removal and gas injection status with naked eyes. In addition, using the vacuum compressor, it takes about 1 minute to remove air from inside the portable vacuum antioxidant bag 100.

The magnet fixing part 50 is formed along the periphery of the opening of the portable vacuum antioxidant bag, and includes a flexible magnet on the periphery of the opening. The electron microscope is made of metal, for example, iron, to which the magnet can be attached. To observe the sample prone to oxidation through the electron microscope, it is necessary to form a vacuum environment for handling the sample. The traditional method including wrapping the vinyl bag around the microscope and fixing it with a tape can only be used for one-time use, and thus has problems with convenience in use and economic efficiency due to leaks. Due to the features of the electron microscope, the magnet fixing part 50 having the flexible magnet on the periphery of the opening of the portable vacuum antioxidant bag may be tightly contact with to a target position of the electron microscope by the magnetic force. For example, the magnet fixing part 50 may include a rubber magnet having high flexibility. The magnet fixing part 50 may be closely fixed to the electron microscope around the target position, so it is easy to block air and attach and detach to/from the electron microscope, and thus can be reused.

FIG. 2 is a detailed view of the air injection cap of the gas inlet 10 or the gas outlet 20 of the portable vacuum antioxidant bag according to an embodiment of the present disclosure.

Referring to FIG. 2, the gas inlet 10 or the gas outlet 20 may be generally formed in the shape of an air injection cap used as an air injection port in a tube, to make it easy to open and close and allow reuse. As shown in FIG. 2, the air injection cap is opened, a hose is connected to the cap, gas is injected, and after gas is injected, the cap is closed to shut off oxygen, thereby preventing oxidation of the sample.

Figure 3A:
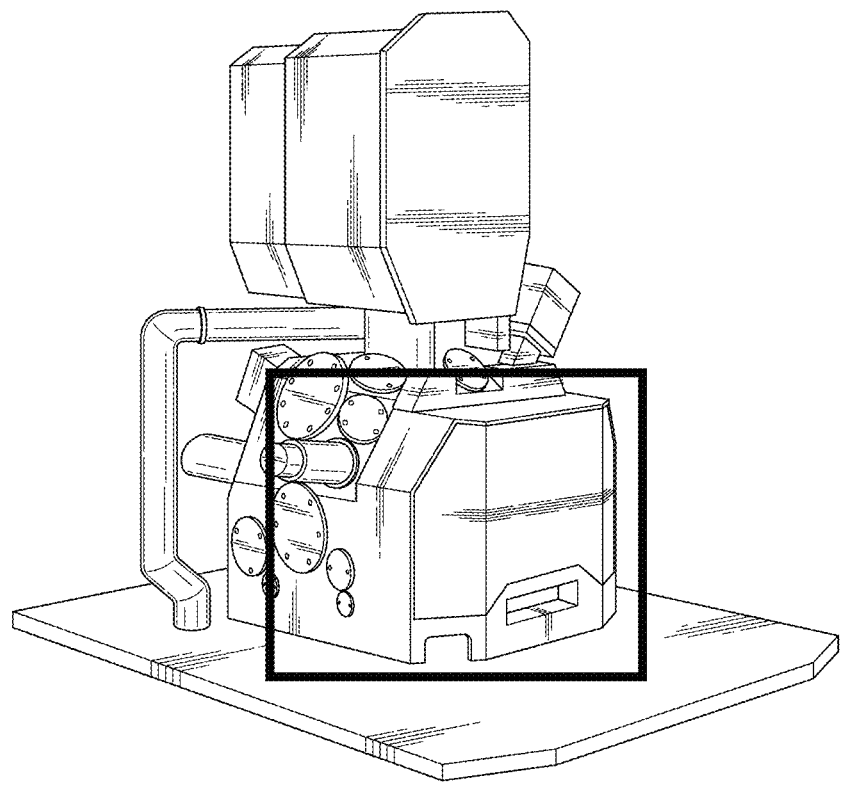
FIGS. 3A and 3B show a location of installation and an example of installed state that the portable vacuum antioxidant bag 100 according to an embodiment of the present disclosure on the electron microscope, respectively.
Figure 3B:
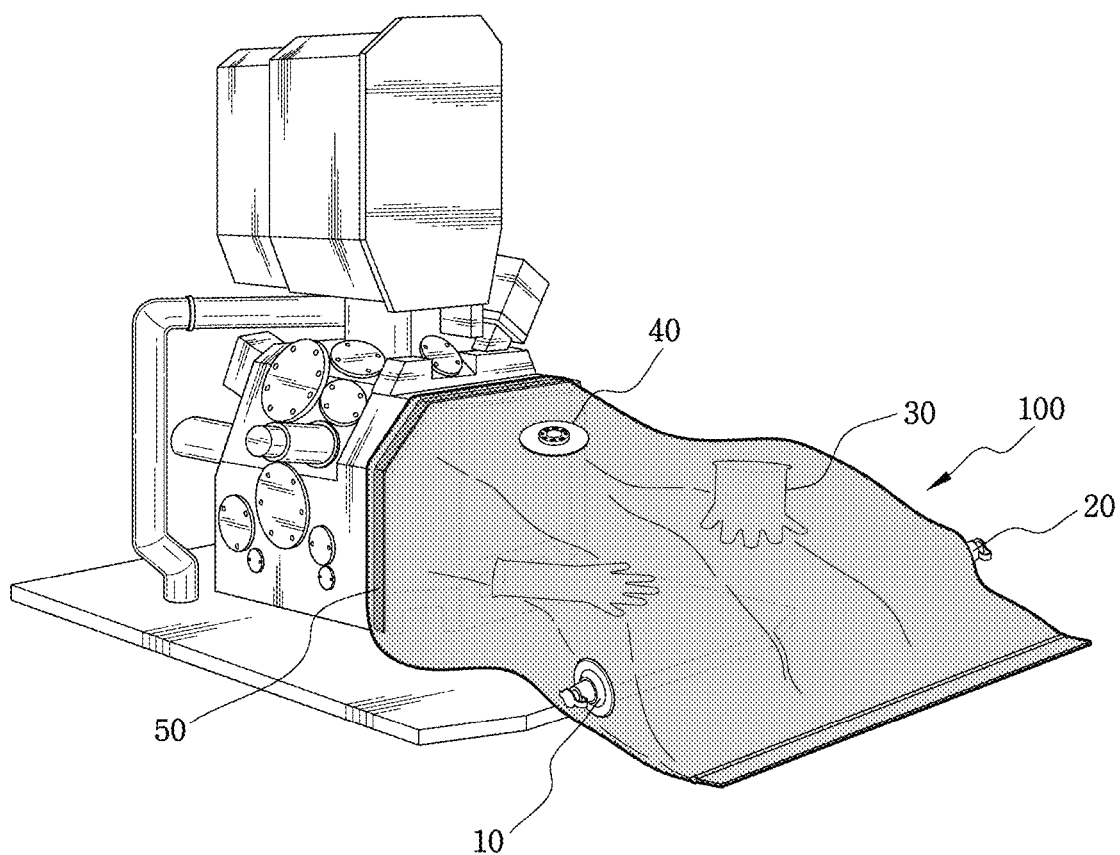

FIGS. 3A and 3B show a location of installation and an example of installed state that the portable vacuum antioxidant bag 100 according to an embodiment of the present disclosure on the electron microscope, respectively.

As shown in FIG. 3A, the portable vacuum antioxidant bag 100 for blocking oxygen may be mounted on a part of the electron microscope where the sample is placed and observed.

As shown in FIG. 3B, the opening of the portable vacuum antioxidant bag 100 is mounted on the corresponding part of the electron microscope, and the magnet fixing part 50 is tightly contact with and installed in the electron microscope. As the magnet fixing part 50 has the flexible magnet along the periphery of the opening of the vacuum antioxidant bag, the magnet fixing part 50 may be stretched to conform to the size and shape of the installation area. The periphery of the magnet fixing part 50 is equal to or smaller than the periphery of the electron microscope at the target position, so that the magnet fixing part 50 may be tightly contact with and installed in the electron microscope. The magnet fixing part 50 formed with the flexible rubber magnet is deformable, and thus may be installed at locations of various sizes and shapes.

Figure 4:
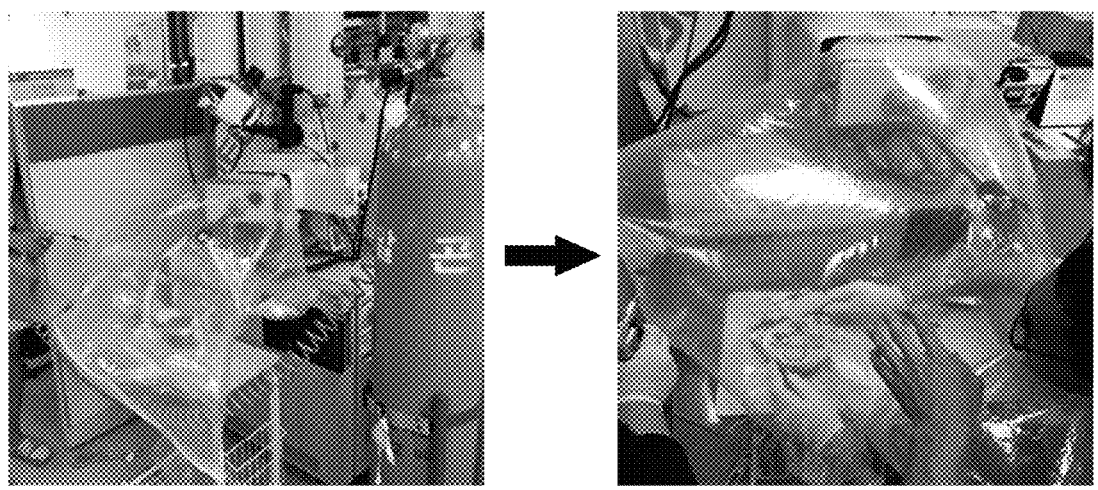
FIG. 4 shows an example of loading a sample while preventing oxidation using a portable vacuum antioxidant bag according to an embodiment of the present disclosure.

FIG. 4 shows an example of loading the sample while preventing oxidation using the portable vacuum antioxidant bag according to an embodiment of the present disclosure.

Referring to FIG. 4, as shown on the left side, the portable vacuum antioxidant bag 100 is installed in the electron microscope, and argon gas is injected through the gas inlet 10. Subsequently, as shown on the right side, when oxygen is removed, the sample may be handled inside the portable vacuum antioxidant bag 100 through the hand-shaped gloves 30.

According to an embodiment of the present disclosure, as shown in FIG. 4, when loading the sample using the portable vacuum antioxidant bag, the gas elements in the portable vacuum antioxidant bag are analyzed, and the analysis results are obtained as described in the following [Table 1].

TABLE 1

| Element | Mass % | Atomic % |
|---------|--------|----------|
| O       | —      | —        |
| Y       | 70.85  | 49.12    |
| Cl      | 29.01  | 50.60    |
| C       | 0.06   | 0.29     |
| Si      | 0.00   | 0.00     |
| Total   | 100    | 100      |

As can be seen from [Table 1], it is found that data associated with oxygen in the portable vacuum antioxidant bag is measured as 0 wt. %. In this instance, it can be seen that oxygen removal is performed within a few minutes. It can be seen that the proposed portable vacuum antioxidant bag is easily installed in the electron microscope and oxygen is effectively removed. Accordingly, using the portable vacuum antioxidant bag proposed herein, it is possible to load and observe the sample prone to oxidation in the electron microscope in a vacuum state, and the portable vacuum antioxidant bag is reusable, thereby providing an environment for observing the sample with economic efficiency.

Figure 5A:
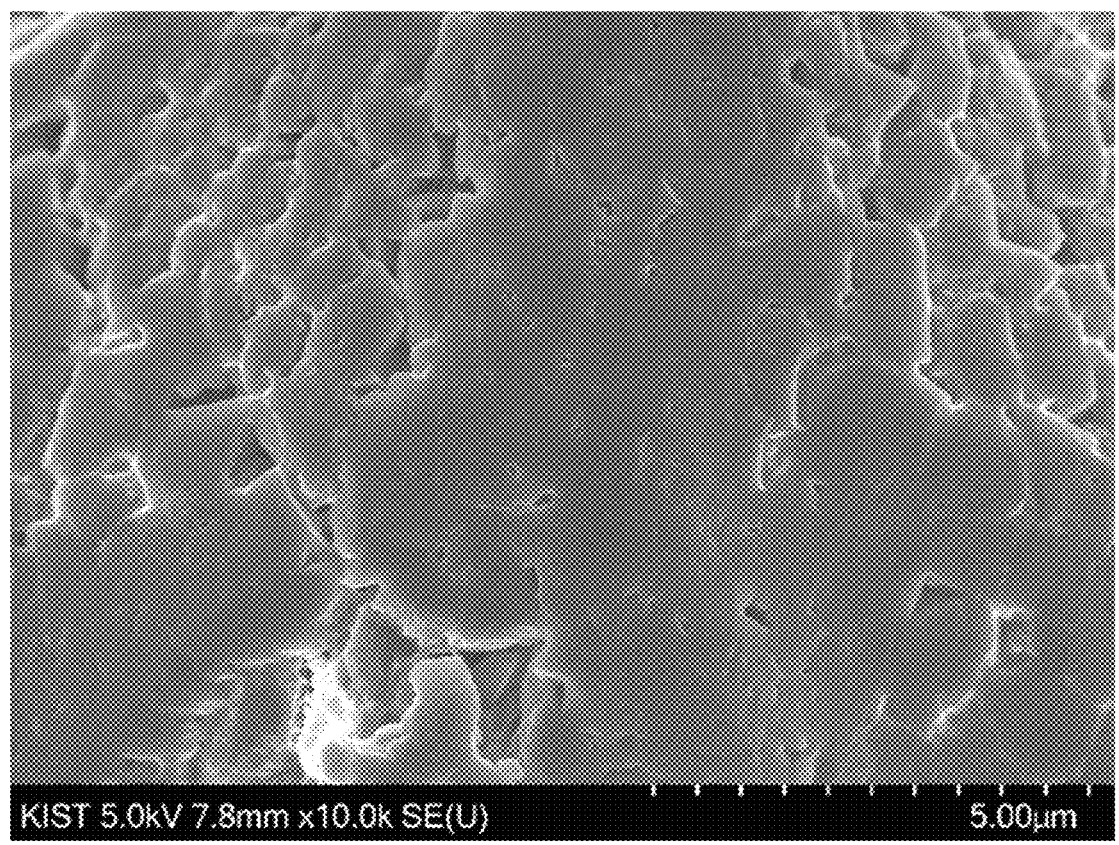
FIGS. 5A and 5B show microscopy analysis results of a sample loaded using the traditional vinyl bag and a sample loaded using the portable vacuum antioxidant bag according to an embodiment of the present disclosure, respectively.
Figure 5B:
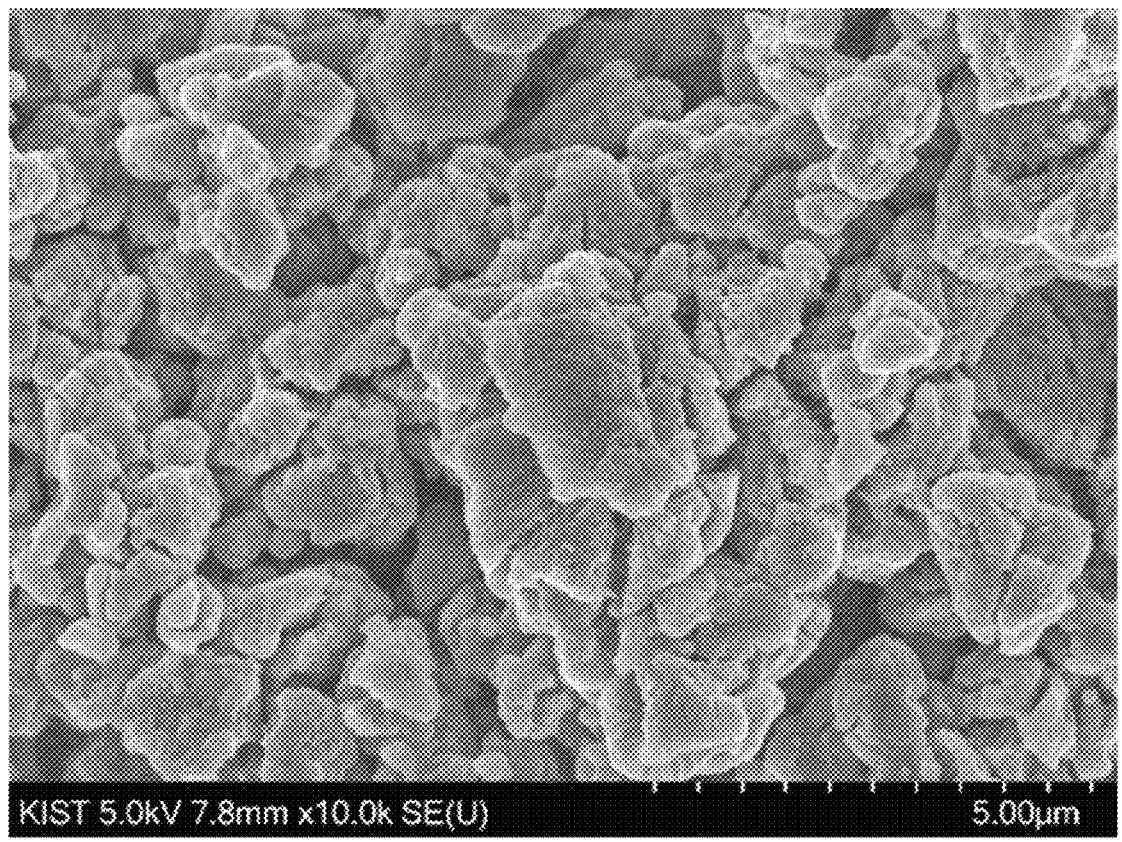

FIGS. 5A and 5B show microscopy analysis results of a sample loaded using the traditional vinyl bag and a sample loaded using the portable vacuum antioxidant bag according to an embodiment of the present disclosure, respectively.

Referring to FIGS. 5A and 5B, FIG. 5A shows a scanning electron microscope (SEM) analysis result obtained by observing the surface of a Li battery sample after blocking oxygen by fixing the Atmos vinyl bag with a tape. In addition, FIG. 5B shows an SEM analysis result obtained by observing the surface of a Li battery sample after blocking oxygen using the portable vacuum antioxidant bag 100 according to an embodiment of the present disclosure.

As shown in FIGS. 5A and 5B, when oxygen is blocked by the traditional method, the SEM analysis result shows that the Li battery sample surface is partially oxidized, and by contrast, when the proposed portable vacuum antioxidant bag 100 is used, the SEM analysis result shows that the Li battery sample surface is not oxidized.

As described above, using the proposed portable vacuum antioxidant bag, it is possible to block oxygen intrusion very effectively, and accordingly, when the portable vacuum antioxidant bag is mounted in the electron microscope to create a vacuum and the sample prone to oxidation is loaded, it is possible to accurately observe the sample in an unoxidized state. The proposed portable vacuum antioxidant bag easily forms a non-oxidizing environment, and is reusable, thereby providing an economic efficiency advantage.

In the above-described particular embodiments, the elements included in the present disclosure are represented in singular or plural form according to the presented particular embodiments. However, for convenience of description, the singular or plural form is suitably selected in the presented context, and the above-described embodiments are not limited to single or multiple elements, and a certain element represented in plural form may be a single element, and a certain element represented in singular form may be multiple elements.

While particular embodiments of the present disclosure have been described, it is obvious that many modifications may be made thereto without departing from the scope of technical spirit set forth in various embodiments. Therefore, the scope of the present disclosure should not be defined as limited to the disclosed embodiments, and should be defined by the appended claims and their equivalents.

| [Detailed Description of Main Elements] | |
|---|---|
| 100: Portable vacuum antioxidant bag | 10: Gas inlet |
| 20: Gas outlet | 30: Gloves |
| 40: Vacuum compression part | 50: Magnet fixing part |

What is claimed is:

1. A portable vacuum antioxidant bag installed in an electron microscope to prevent oxidation of a sample, the portable vacuum antioxidant bag comprising:

a magnet fixing part with a flexible magnet attached on an opening of the portable vacuum antioxidant bag;

a gas inlet and a gas outlet formed on two sides of the portable vacuum antioxidant bag, the gas inlet through which gas is injected into the portable vacuum antioxidant bag, and the gas outlet through which air exits the portable vacuum antioxidant bag by the injected gas; and a pair of gloves formed in a shape of hands inside of the portable vacuum antioxidant bag, wherein the portable vacuum antioxidant bag is tightly contact with the electron microscope by the magnetic force of the magnet fixing part.

2. The portable vacuum antioxidant bag according to claim 1, further comprising:

a vacuum compression part to provide an interface for air removal using a vacuum compressor to remove air from the portable vacuum antioxidant bag.

3. The portable vacuum antioxidant bag according to claim 1, wherein at least one of the gas inlet or the gas outlet has an air injection cap that can be opened and closed.

* * * * *